United States Patent
Chillara et al.

(10) Patent No.: US 10,295,580 B2
(45) Date of Patent: May 21, 2019

(54) ON-CHIP MEASUREMENT FOR PHASE-LOCKED LOOP

(71) Applicant: Analog Devices Global, Hamilton (BM)

(72) Inventors: Vamshi Krishna Chillara, Limerick (IE); Pablo Cruz Dato, Valencia (ES); Declan M. Dalton, Ballyneety (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/284,374

(22) Filed: Oct. 3, 2016

(65) Prior Publication Data

US 2018/0095119 A1 Apr. 5, 2018

(51) Int. Cl.
| | |
|---|---|
| *G01R 23/02* | (2006.01) |
| *H03L 7/091* | (2006.01) |
| *H03L 7/099* | (2006.01) |
| *H03L 7/107* | (2006.01) |
| *H03L 7/08* | (2006.01) |

(52) U.S. Cl.
CPC ............ *G01R 23/02* (2013.01); *H03L 7/08* (2013.01); *H03L 7/091* (2013.01); *H03L 7/0993* (2013.01); *H03L 7/1075* (2013.01); *H03L 2207/50* (2013.01)

(58) Field of Classification Search
CPC ...... H03L 7/1075; H03L 7/0993; H03L 7/091
See application file for complete search history.

(56) References Cited

U.S. PATENT DOCUMENTS

| | | | | |
|---|---|---|---|---|
| 5,218,325 | A | * | 6/1993 | Trelewicz ............ H03B 5/1203 331/117 FE |
| 5,898,336 | A | * | 4/1999 | Yamaguchi ........... H03L 7/0895 327/147 |
| 6,414,555 | B2 | | 7/2002 | Staszewski et al. |
| 7,145,399 | B2 | | 12/2006 | Staszewski et al. |
| 7,460,499 | B2 | | 12/2008 | Elizer et al. |

(Continued)

FOREIGN PATENT DOCUMENTS

| | | |
|---|---|---|
| CN | 103873056 A | 6/2014 |
| CN | 104052474 A | 9/2014 |

(Continued)

OTHER PUBLICATIONS

U.S. Appl. No. 14/794,661, filed Jul. 8, 2015, Dato et al.

(Continued)

*Primary Examiner* — Giovanni Astacio-Oquendo
*Assistant Examiner* — Alvaro Portich
(74) *Attorney, Agent, or Firm* — Knobbe, Martens, Olson & Bear, LLP

(57) ABSTRACT

A chip includes a phase-locked loop (PLL) and a test controller. The PLL includes an oscillator and a phase detector. In a normal mode, a first feedback loop includes a phase detector and an oscillator that generates an output based on a frequency input signal. In a test mode, the PLL is re-configured. The output of the loop filter can be decoupled from the input of the oscillator in the test mode and instead be coupled to the input of the phase detector. The oscillator can receive a test tuning signal provided by the test controller. In this test mode configuration, the PLL can measure the frequency of the oscillator.

18 Claims, 10 Drawing Sheets

(56) References Cited

U.S. PATENT DOCUMENTS

| | | | |
|---|---|---|---|
| 7,668,279 B1* | 2/2010 | You | H03L 7/093 375/376 |
| 7,714,669 B2 | 5/2010 | Gotz et al. | |
| 7,958,408 B2 | 6/2011 | de Obaldia et al. | |
| 8,390,349 B1* | 3/2013 | Ravi | G04F 10/005 327/147 |
| 8,536,916 B1 | 9/2013 | Van Engelen | |
| 9,000,974 B2 | 4/2015 | Vacanti | |
| 9,148,153 B2 | 9/2015 | Lu et al. | |
| 9,455,854 B2 | 9/2016 | Gao et al. | |
| 2002/0191727 A1 | 12/2002 | Staszewski et al. | |
| 2003/0141936 A1 | 7/2003 | Staszewski et al. | |
| 2003/0215045 A1* | 11/2003 | Nagata | H03L 7/087 375/376 |
| 2004/0148580 A1 | 7/2004 | de Obaldia et al. | |
| 2005/0137816 A1 | 6/2005 | Chuang et al. | |
| 2006/0002501 A1 | 1/2006 | Muller | |
| 2006/0220758 A1 | 10/2006 | Rachedine et al. | |
| 2007/0189417 A1 | 8/2007 | Waheed et al. | |
| 2008/0197830 A1 | 8/2008 | Mehas | |
| 2009/0070568 A1 | 3/2009 | Shi et al. | |
| 2009/0195440 A1 | 8/2009 | Saunders | |
| 2010/0010288 A1 | 1/2010 | Edwards | |
| 2010/0134159 A1* | 6/2010 | Jin | H03L 7/087 327/156 |
| 2011/0234270 A1 | 9/2011 | Kobayashi | |
| 2011/0234327 A1* | 9/2011 | Kobayashi | H03L 7/085 331/1 R |
| 2012/0013377 A1* | 1/2012 | Zhang | G01R 25/08 327/159 |
| 2012/0201338 A1 | 8/2012 | Leung et al. | |
| 2013/0106522 A1* | 5/2013 | Kobayashi | H03L 1/028 331/16 |
| 2013/0120072 A1* | 5/2013 | Murphy | H03L 7/0891 331/17 |
| 2013/0301754 A1 | 11/2013 | Staszewski | |
| 2014/0085012 A1 | 3/2014 | Wu et al. | |
| 2014/0145769 A1 | 5/2014 | Lin | |
| 2014/0225635 A1 | 7/2014 | Dasnurkar | |
| 2014/0340161 A1 | 11/2014 | Canard et al. | |
| 2015/0180485 A1* | 6/2015 | Shanan | H03L 7/099 327/156 |
| 2015/0349992 A1 | 12/2015 | Gao | |
| 2016/0036454 A1 | 2/2016 | Moehlmann | |
| 2016/0344396 A1 | 11/2016 | Moehlmann | |
| 2016/0344538 A1* | 11/2016 | Moehlmann | H03L 7/093 |

FOREIGN PATENT DOCUMENTS

| | | |
|---|---|---|
| JP | 2008130213 A | 6/2008 |
| JP | 2014095690 A | 5/2014 |

OTHER PUBLICATIONS

Wu, et al., "A mm-Wave FMCW Radar Transmitter Based on a Multirate ADPLL," 2013 IEEE Radio Frequency Integrated Circuits Symposium, Jun. 2013, pp. 107-110.

Wu, Wanghua, "Millimeter-Wave Digitally-Assisted Frequency Synthesizer in CMOS," Doctoral Thesis, Delft University of Technology, 2013.

Temporiti, et al., "A 3 GHz Fractional All-Digital PLL With a 1.8 MHz Bandwidth Implementing Spur Reduction Techniques," IEEE Journal of Solid-State Circuits, vol. 44, No. 3, Mar. 2009, pp. 824-834.

Mar. 14, 2018 Office Action for related German Application No. 102017122872.1 in 6 pages.

* cited by examiner

ON-CHIP MEASUREMENT FOR PHASE-LOCKED LOOP

FIELD OF DISCLOSURE

Embodiments of the disclosure relate to phase-locked loops, and more particularly to measuring and testing of phase-locked loops.

BACKGROUND

A phase-locked loop is a control system that generates an output signal with a phase that is related to a phase of an input signal. Processes for making phase-locked loop devices encounter variations. Therefore, manufacturers use test tools, which can be expensive, to test and/or characterize phase-locked loop devices. Using test tools and running tests can also take time, which can increase the overall production time.

SUMMARY OF THE DISCLOSURE

One aspect of this disclosure is a phase-locked loop operable in a plurality of modes. The phase-locked loop comprises an oscillator configured to generate an oscillating output signal and a loop filter configured to filter an output of a phase detector of the phase-locked loop. An input to the oscillator is coupled to an output of the loop filter in a first mode. The input to the oscillator is decoupled, at least in part, from the output of the loop filter in a second mode. The phase-locked loop is configured to output an indication of a frequency of the oscillating output signal based at least partly on an output of the loop filter in the second mode.

In some embodiments, the phase-locked loop further comprises a time to digital converter, wherein the oscillator is a digitally controlled oscillator and the time-to-digital converter is coupled in a feedback path between the digitally controlled oscillator and the loop filter in the first mode. In some embodiments, the phase-locked loop further comprises an adder configured to combine a frequency input signal with a filtered output signal provided by the loop filter in the second mode. In some embodiments, the phase-locked loop further comprises a first switch configured to provide a tuning signal to the oscillator in the first mode and to provide a test tuning signal to the oscillator in the second mode, wherein the tuning signal is based on an error signal generated by the phase detector of the phase-locked loop, and wherein the test tuning signal is based on a source independent of the error signal. In some embodiments, the phase-locked loop comprises a second switch configured to provide the tuning signal to the phase detector in the first mode and to close a feedback loop comprising the loop filter, the phase detector, and an adder in the second mode. In some embodiments, the indication of the frequency of the oscillating output signal is based on an output of the loop filter combined with a frequency input signal. In some embodiments, the entire input of the oscillator is decoupled from the loop filter in the second mode.

Another aspect of this disclosure is a method of testing a phase-locked loop. The method includes configuring an input of an oscillator of the phase-locked loop to be independent of an output of the oscillator in a test mode, providing a feedback path from an output of a phase detector to an input of the phase detector in the test mode; and providing an output from the feedback path to a test controller implemented on the same chip as the phase-locked loop.

In some embodiments, the oscillator is a digitally controlled oscillator. In some embodiments, the feedback comprises a loop filter coupled to the output of the phase detector, an adder, and a switch coupled between an output of the loop filter and the input of the phase detector. In some embodiments, the method further includes determining, based at least in part on the output from the feedback path, a frequency of an oscillating output signal generated by the oscillator in response to a test tuning signal being provided to the oscillator, the test tuning signal being independent of the output of the oscillator. In some embodiments, the method further includes providing a test frequency input signal to the feedback path such that the output from the feedback path locks faster than if the test frequency input signal were not provided. In some embodiments, the method further includes providing a test tuning signal to the oscillator, the test tuning signal being independent of the output of the oscillator, and changing a bandwidth of the loop filter from a first bandwidth to a narrower bandwidth while the test tuning value is provided to the oscillator.

Another aspect of this disclosure is a chip comprising a digitally controlled oscillator (DCO) of a phase-locked loop (PLL), a multiplexer configured to couple an input of the DCO to an output of a phase detector of the PLL in a first mode and to provide a test oscillator tuning word to the input of the DCO in a second mode, and a test control circuit configured to provide, in the second mode, the test oscillator turning word and also configured to determine, in the second mode, an indication of an output frequency of the PLL. The test control circuit and the DCO are embodied on the same chip.

In some embodiments, the chip further comprises a time-to-digital converter in a feedback path from the output of the DCO to the phase detector. In some embodiments, the phase detector is configured to generate an error signal in the second mode based on a comparison of a feedback signal from the feedback path with a frequency command output signal that is dependent on the output of the phase detector, wherein the frequency command output signal is the indication of the output frequency of the PLL. In some embodiments, the test control circuit is further configured to provide a frequency command word in the second mode, and the frequency command word is associated with the test oscillator tuning word in a memory of the test control unit. In some embodiments, the test control circuit is further configured to generate a test result based on a frequency of a reference clock and the frequency command output signal. In some embodiments, the chip further comprises a digital loop filter configured to filter a digital error signal generated by the phase detector, wherein an output of the digital loop filter is coupled to the input of the DCO in the first mode. In some embodiments, the digital loop filter is configured to operate with a first bandwidth and then operate with a second bandwidth that is narrower than the first bandwidth in the second mode for the same test oscillator tuning word. In some embodiments, the chip further comprises an adder configured to generate a frequency command word output as a digital sum, wherein the frequency command word output is the indication of the output frequency of the PLL, the output of the digital loop filter is coupled to a first input of the adder, and a frequency command word is provided to a second input of the adder.

For purposes of summarizing the disclosure, certain aspects, advantages, and novel features have been described herein. It is to be understood that not necessarily all such aspects, advantages, and novel features are achieved in accordance with any particular embodiment. Thus, one or

DETAILED DESCRIPTION

Figure 1:
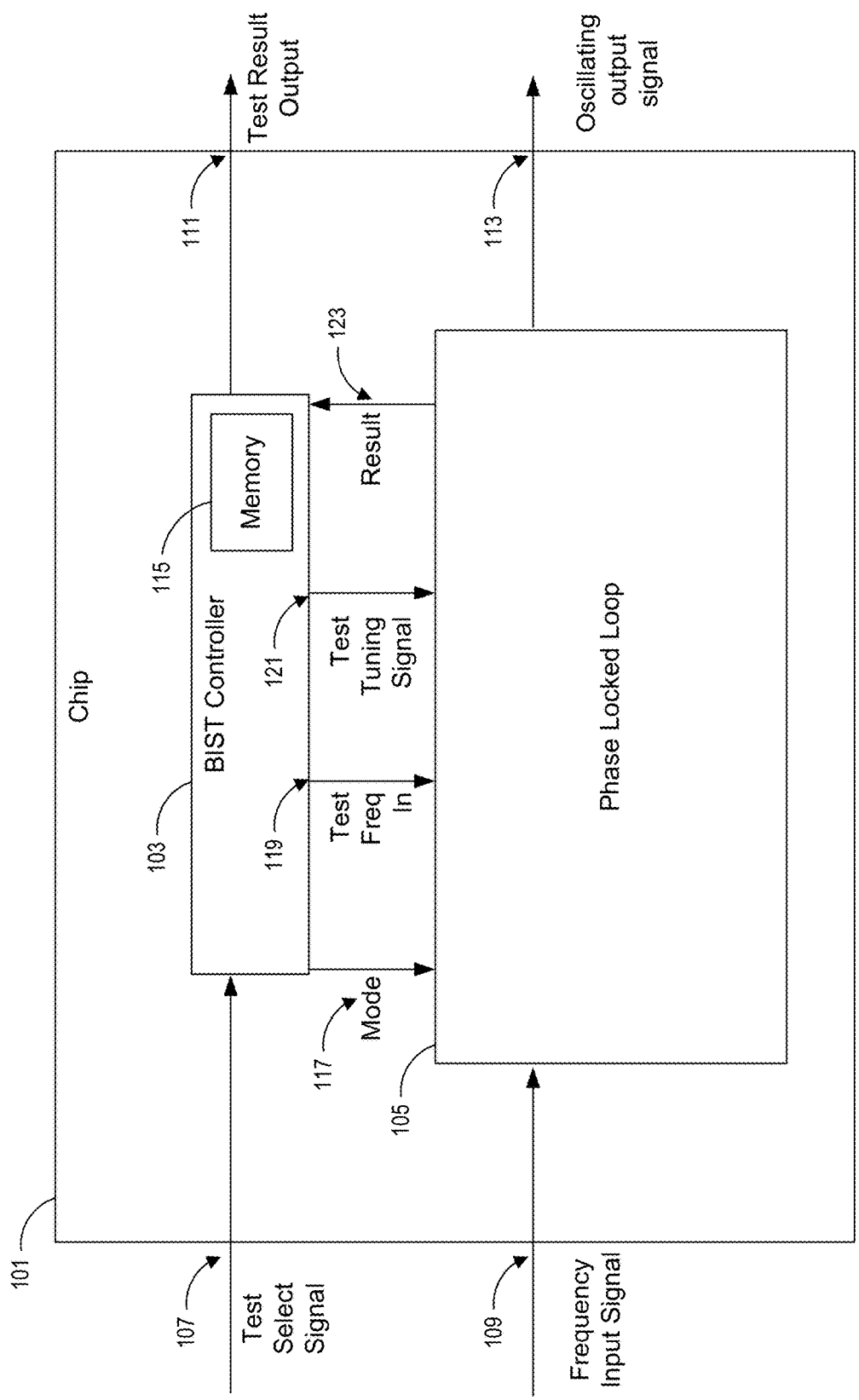
FIG. 1 is a schematic diagram of a chip with a built-in self-test controller for a phase-locked loop according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numbers can indicate identical or functionally similar elements. It will be understood that elements illustrated in the figures are not necessarily drawn to scale. Moreover, it will be understood that certain embodiments can include more elements than illustrated in a drawings and/or a subset of the illustrated elements in a particular drawing. Further, embodiments can incorporate any suitable combination of features from two or more drawings.

Silicon technology continues to advance and enable production of complex mixed-signal systems on a single chip. As the complexity of chips continue to grow, the costs associated with testing and characterizing the chips can also grow. Testing costs can make up a significant share of the total production cost of an integrated circuit (IC).

Built-in self-test (BIST) circuitry can reduce the costs and/or delays associated with testing ICs. Some digital portions of the ICs can be tested using scan chains. However, it can be more difficult, expensive, and/or time consuming to test other types of digital circuits, including radio frequency (RF) circuits and mixed-signal circuits. IC producers may use external test equipment. However, such equipment can be expensive, and using external equipment can increase production time.

One example of a mixed-signal block is a phase-locked loop (PLL). PLLs can be used for frequency synthesis. A PLL typically includes an oscillator, such as digitally controlled oscillator (DCO) or voltage controlled oscillator (VCO). Characterizing a PLL can include using expensive external test equipment. The external equipment can use counters to count the PLL or oscillator's oscillations or output clock periods during a duration set by a reference clock. The external test equipment can obtain an accurate estimate by averaging a large number of such counts. However, counting an output over a time period for each frequency input can take a long time, increasing production times.

Some on-chip alternatives try to mimic the behavior of the external test equipment by implementing counters of external test equipment and/or other test circuitry on the IC or within a chip. This approach is may not be feasible and/or may not reduce costs relative to external testing. Including additional components on a chip can add significantly to the area and power consumption of the chip.

Some embodiments disclosed herein related to a PLL system with BIST functionality that uses PLL elements (e.g., adders, filters, oscillators, feedback elements such as time-to-digital converters and counters, or any combination thereof) to test the PLL. By using parts of the PLL system to test the PLL, less die area is consumed for dedicated BIST components relative to other solutions, allowing more chips to be made per wafer and lowering production costs. Methods disclosed herein can test and/or characterize a PLL without dedicated BIST counters, which can consume sizeable area, and/or expensive external test equipment. Such methods can be faster than using external test equipment. Furthermore, a bandwidth of a loop filter can be adjusted during testing to increase the test speed, reducing production time. In certain embodiments, an indication of output frequency of a PLL can be calculated by multiplying a test result by a reference clock frequency. This calculation is less complicated than other methods that related to performing dedicated counting the oscillations of the PLL and averaging the oscillations over an extended time period.

Systems for testing and/or measuring frequency are disclosed herein. The various embodiments can have one, some, or all of the following features. An on-chip measurement system can quickly and accurately measure an oscillating frequency of an oscillator of a PLL, such as a DCO or a VCO. The testing can be performed using a built-in self-test unit. The testing can be performed without external test equipment. The PLL can be reconfigured such that an oscillator tuning word (OTW) (and hence, its oscillator frequency) is fixed. The loop can acquire a frequency command word ($FCW_{out}$) corresponding to the oscillating frequency. The $FCW_{out}$ and the reference clock frequency $f_{REF}$ can be used to determine a frequency of the oscillator.

The PLL can be configured in at least two different modes. One mode can be a PLL operational mode, and the other mode can be a test mode for testing or characterizing the PLL. When in a test mode, parts of the PLL can be used to determine the oscillating frequency of an oscillator of the PLL for a given input to the oscillator. When in the test mode, one or more of an adder, a phase detector, a loop filter, an oscillator, and feedback circuitry (e.g., a counter and/or time-to-digital converter) of the PLL can be used to determine the oscillating frequency. Accordingly, a relatively small chip area can be dedicated to BIST circuitry.

The PLLs discussed herein can be tested and/or characterized without external testing equipment. Such PLLs can be tested and/or characterized faster than by testing with external testing equipment. Testing and/or characterizing the PLLs can include changing a bandwidth of the loop filter of the PLL. This can include narrowing a bandwidth of the loop filter while an input (e.g., an OTW) is provided to an oscillator is fixed and an indication of oscillator frequency (e.g., result signal further described with respect to FIG. 2, $FCW_{OUT}$ further described with respect to FIG. 3 and FIG. 6) is acquired from the PLL during a testing duration as measured by a reference clock. In some embodiments, an on-chip BIST controller can determine an output within 2 kHz accuracy for a 10 GHz output clock or 0.2 ppm accuracy in less than 500 µs, which is about 20 times faster compared to some external test setups. However, some embodiments can perform with different amounts of speed and accuracy.

Characterizing the PLLs can include determining a frequency output of the PLL while the input is supplied to an oscillator of the PLL by measuring the indication of frequency of the oscillator. Characterizing the PLL can include determining a plurality of frequency outputs of the PLL for a range of inputs to the oscillator (e.g., OTWs). Characterizing the PLL can include determining a change in the frequency output for the PLL per change in the input to the oscillator. The PLL can be tested for a pass or fail based on the characterization of the PLL.

Switches (including multiplexers) switch circuit paths based on a mode select signal. It is to be understood that not necessarily all such features are achieved in accordance with any particular embodiment. Thus, various embodiments may include one or more features as taught herein without necessarily including other features as can be taught or suggested herein.

FIG. 1 is a schematic diagram of a chip 101 with a built-in self-test controller for a phase-locked loop. The chip 101 includes a phase-locked loop 105 and a BIST controller 103 that can include a memory 115. The chip 101 has a test select signal path 107, a frequency input signal path 109, a test result output path 111, and an oscillating output signal path 113. The BIST controller 103 can communicate with the PLL 105 over signal paths including a mode signal path 117, a test tuning signal path 121, and a result signal path 123. In some embodiments, the BIST controller 103 can communicate with the PLL 105 over a test frequency input signal path 119.

Figure 5:
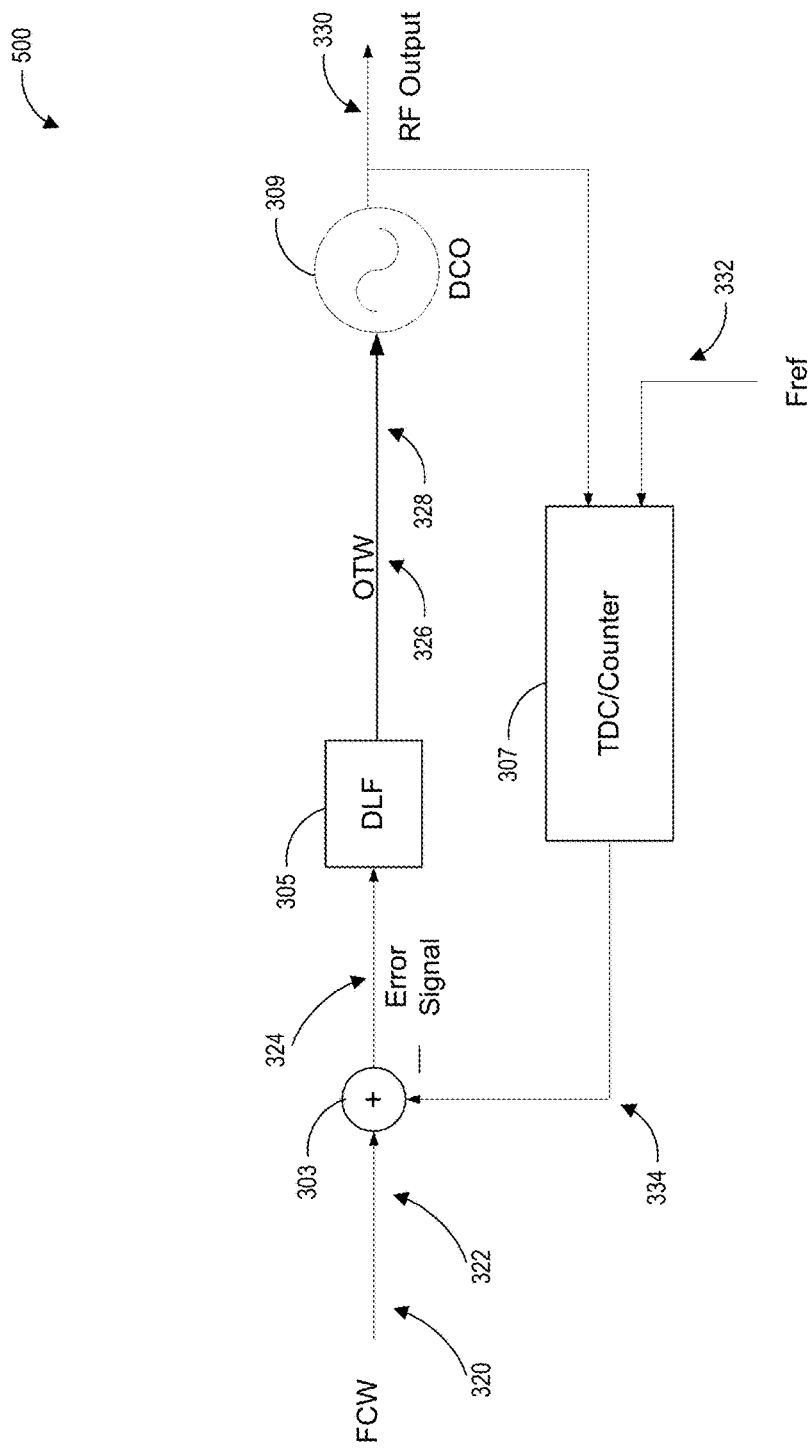
FIG. 5 is a schematic block diagram of a digital phase-locked loop that is functionally equivalent to the phase-locked loop of FIG. 3 in a normal mode.

The chip 101 can be an integrated circuit or a packaged chip that includes radio frequency (RF) and mixed-signal blocks such as the PLL 105. The PLL 105 can generate an oscillating output signal over the oscillating output signal path 113. The PLL 105 can be implemented in accordance with any of the principles and advantages of the PLLs discussed herein, such as the PLL 200 of FIG. 2 and/or the digital PLL (DPLL) 300 of FIG. 3. One or more properties, such as frequency or phase, of the oscillating output signal can depend on one or more properties of a frequency input signal received over the frequency input signal path. The PLL 105 can be used to generate the oscillating output signal based on the frequency input signal during a first or "normal" mode of operation in which the oscillating output signal has a phase that is locked to the phase of the frequency input signal. An example of a digital phase-locked loop that is functionally equivalent to the PLL of FIG. 3 in a normal mode is shown in FIG. 5.

Figure 6:
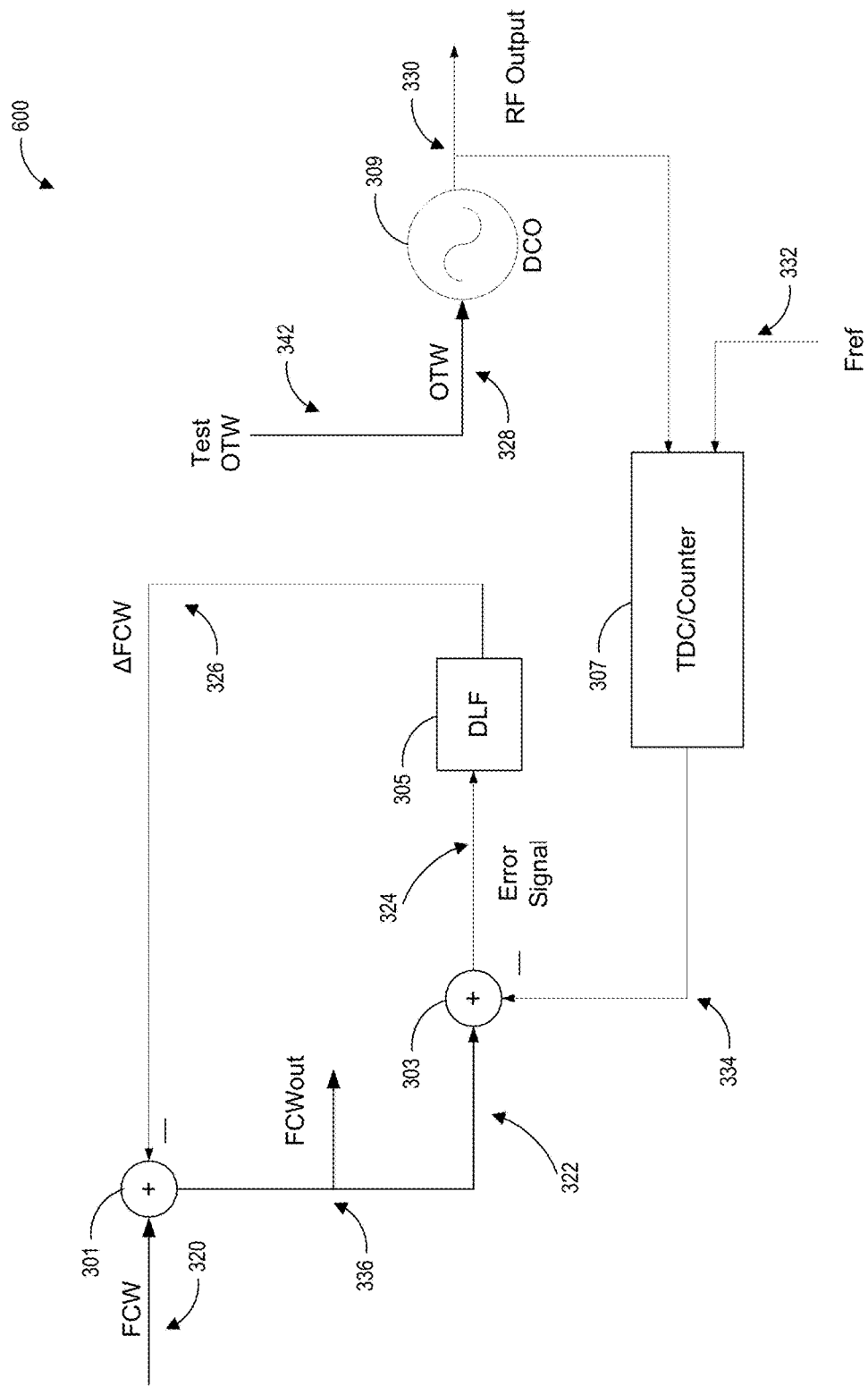
FIG. 6 is a schematic block diagram of a digital phase-locked loop that is functionally equivalent to the phase-locked loop of FIG. 3 in a test mode.

The BIST controller 103 can be used to characterize and test the PLL. During a second or "test" mode of operation, the BIST controller 103 can assert a mode signal over the mode path 117 to cause the PLL to reconfigure for testing and characterization. An example block diagram of a digital phase-locked loop that is functionally equivalent to the PLL of FIG. 3 in a test mode is shown in FIG. 6. In the test mode, the BIST controller 103 can provide the test tuning signal (e.g., the test tuning signal shown in FIG. 2, the test OTW signal shown in FIG. 3 and in FIG. 6) to the PLL. The test tuning signal can be provided according to sequences or to sequence pairs stored in the memory 115. In some embodiments, the BIST controller 103 can provide a test frequency input (e.g., the FCW shown in FIG. 3 and in FIG. 6, the frequency input signal shown in FIG. 2) as an initial estimate or seed value, which can reduce the measurement time. In some embodiments, a common value test frequency input can be used for all test OTW inputs. In some embodiments it is possible to provide different test frequency inputs corresponding to each test OTW input. In some embodiments, the test frequency input signal(s) can be stored in the memory 115.

In the test mode, the BIST controller 103 can receive a result signal from the PLL 105. The result can be processed to determine one or more characteristics of the PLL 105. Accordingly, one or more signals generated during the test mode can be used to characterize the performance of the PLL 105 that should occur during the normal mode. If the characteristics of the PLL 105 satisfy a specification, such as an expected value within a margin of error, across a tested range of test tuning signals, then the BIST controller 103 can determine that the PLL 105 passes the test and generate a pass signal over the test result output path 111. If the characteristics of the PLL 105 fail, then the BIST controller 103 can generate a fail signal over the test result output path 111. The characteristics can also be used to determine the gain of the oscillator for each OTW value. The variations in oscillator gain for different OTW inputs can be used to calibrate the gain of the oscillator to compensate for gain variations across the range of OTW inputs. A calibrated gain can improve the consistency and control of loop dynamics when the PLL is operated in normal mode.

In the example embodiment shown in FIG. 1, the BIST controller 103 is on the same chip as the PLL 105. In some other embodiments, some BIST functions may be provided external to the chip 101. In FIG. 1, the BIST controller 103 is drawn for clarity and does not necessarily show the BIST controller 103 to scale with the PLL 105. In some embodiments, chip area is saved because circuitry from the PLL 105 is reused for testing purposes, so the BIST controller 103 can be smaller or vary in size.

Figure 2:
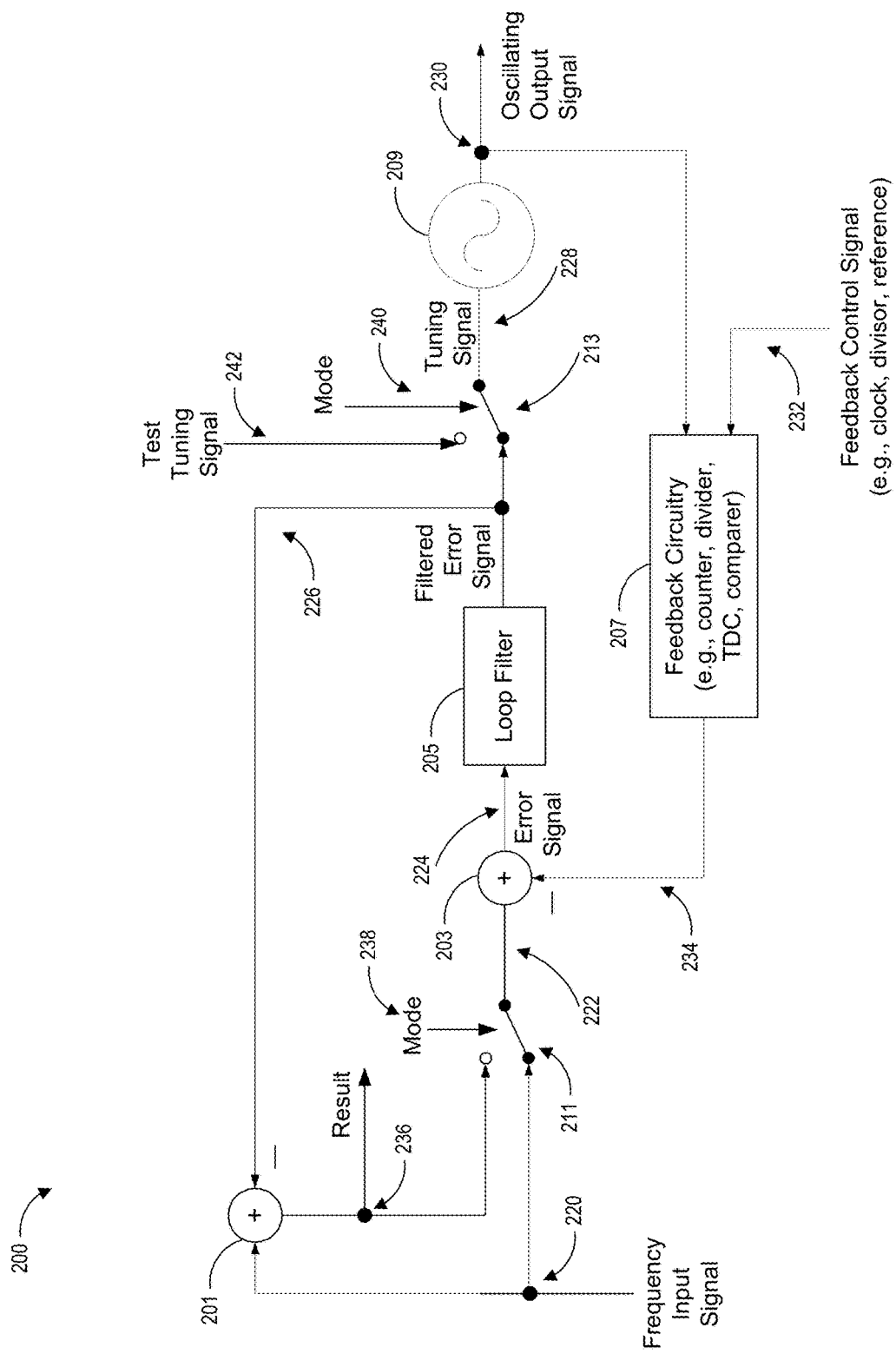
FIG. 2 is a schematic block diagram of a phase-locked loop according to an embodiment.

FIG. 2 shows an example block diagram of a phase-locked loop 200. The PLL 200 includes a first adder 201, a phase detector 203, a loop filter 205, feedback circuitry 207 (e.g., a counter, a divider, a time-to-digital converter (TDC), a comparer, or any suitable combination thereof), an oscillator 209, a first switch 211, and a second switch 213. FIG. 2 also includes signal paths 220, 222, 224, 226, 228, 230, 232, 234, 236, 238, 240, and 242. The PLL 200 can function in at least two modes of operation.

In the normal mode, a frequency input signal is combined with a feedback signal using the phase detector 203. The phase detector 203 can subtract the feedback signal from a frequency input signal (e.g., a frequency command word for a DPLL) to generate an error signal. The error signal is filtered by a loop filter 205 to generate a filtered error signal, which is provided as the tuning signal used to control the oscillator 209. The oscillator 209 outputs an oscillating output signal, which is also provided to feedback circuitry 207 to generate the feedback signal. The steady state oscillating output signal generated by the oscillator 209 is controlled by the frequency input signal, for example, according to Equation 1:

$$f_{OUT1} = \text{FrequencyInputSignal} \times f_{REF} \qquad \text{Eq. 1}$$

Figure 3:
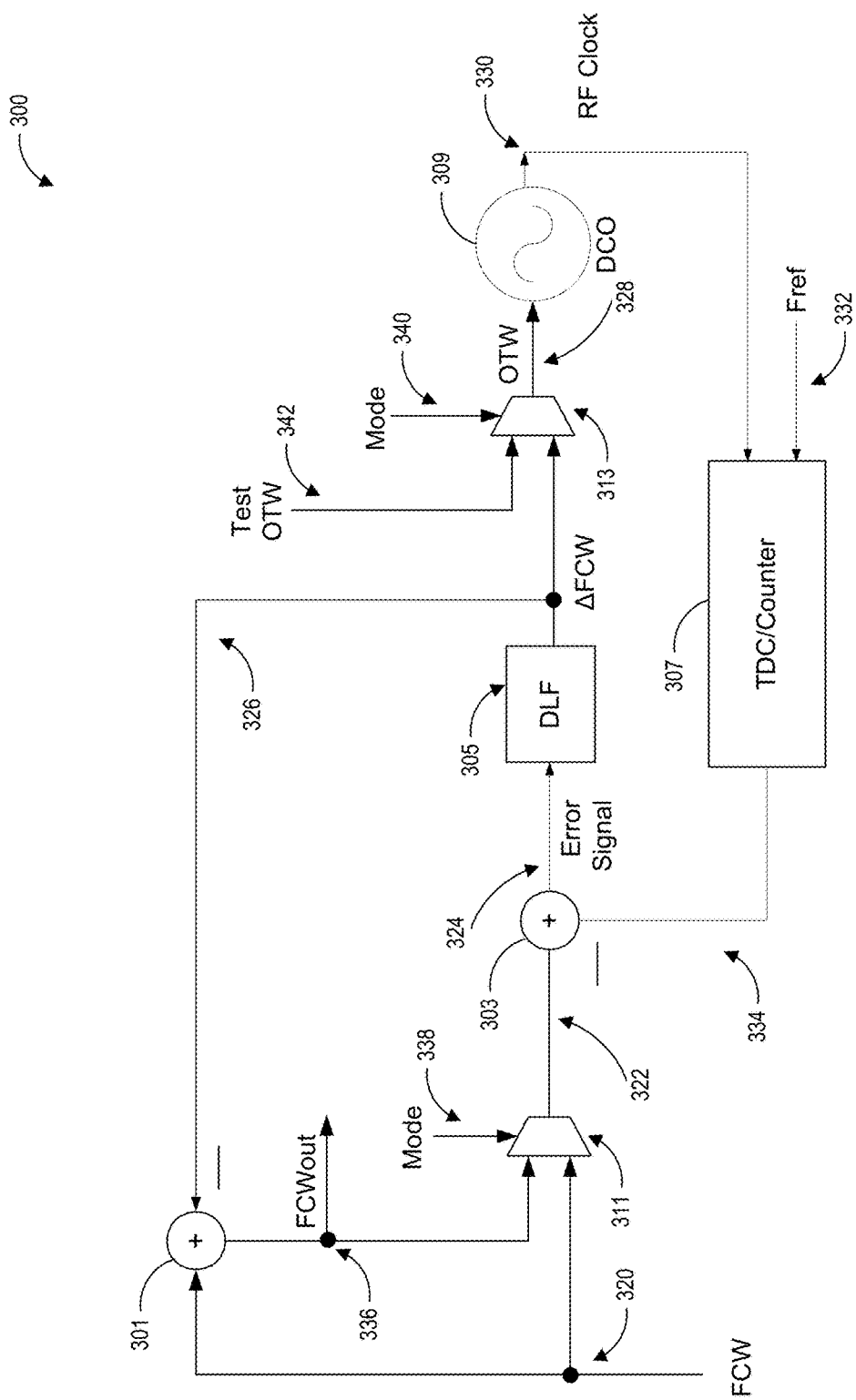
FIG. 3 is a schematic block diagram of a digital phase-locked loop according to an embodiment.

In Equation 1, $f_{OUT1}$ is the frequency of the oscillating output signal in the normal mode. For digital PLLs (e.g., as shown in FIG. 3), FrequencyInputSignal is a Frequency Control Word. $f_{REF}$ is a frequency of a reference clock (e.g., frequency of a clock signal provided over signal path 232). Equation 1 can apply to analog PLLs (e.g., where FrequencyInputSignal is a divider ratio). The phase detector 203 compares the oscillating output signal to the frequency input signal to generate the error signal, which is filtered to remove noise. The filtered error signal is provided to the oscillator 209 to adjust the oscillating output signal based on feedback.

In the test mode, the PLL 200 can be configured differently. A BIST controller, such as the BIST controller 103 of FIG. 1, can provide a test tuning signal, which is provided as the tuning signal to the oscillator 209. The oscillator 209 outputs an oscillating output signal based on the tuning signal. The oscillating output signal is provided to feedback circuitry 207, which does not form part of a closed feedback loop in the test mode. The phase detector 203 can subtract the output of the feedback circuitry 207 from a result signal provided to the phase detector 203, thereby generating the error signal. The error signal is provided to the loop filter 205, which outputs a filtered error signal. The filtered error signal can be changed in sign and added to (or subtracted from) a frequency input signal using an adder 201 to generate the result signal.

In the test mode, the test tuning signal can be provided by a BIST controller, such as the BIST controller 103 of FIG. 1. The BIST controller 103 can analyze the result signal to characterize or test the PLL 200, for example, according to Equation 2:

$$f_{OUT2} = f_{REF} \times R_{ESULT} \qquad \text{Eq. 2}$$

In Equation 2, $f_{OUT2}$ is the frequency of the oscillating output signal in the test mode, $f_{FEF}$ is the frequency of a reference signal (e.g., a clock signal on path 232), and $R_{ESULT}$ is the result signal. Accordingly, the frequency of the oscillating output signal $f_{OUT2}$ in the test mode generated by the PLL can be calculated for a given test tuning signal when a reference clock is used.

Mode signal paths 238, 240 can receive a mode signal provided by a BIST controller, such as BIST controller 103 of FIG. 1. The switches 221, 213 can be controlled by the mode signal to reconfigure the PLL to operate in the normal mode or the test mode. The switches in FIG. 2 are shown in the normal mode position.

Switch 211 switches between providing the result signal and providing the frequency input signal to the phase detector 203. In the normal mode, switch 211 provides the frequency input signal to the phase detector 203. In the normal mode, switch 211 also operates to break or decouple the feedback loop that includes the first adder 201, the phase detector 203, and the loop filter 205. In the test mode, switch 211 provides the result signal to the phase detector 203. In the test mode, switch 211 also completes a feedback loop that includes the first adder 201, the phase detector 203, and the loop filter 205.

Switch 213 switches between providing the test tuning signal and providing the filtered error signal to the oscillator 209. In the normal mode, switch 213 provides the filtered error signal to the oscillator 209. In the normal mode, switch 213 also operates to complete the feedback loop that includes the oscillator 209, the feedback circuitry 207, the phase detector 203, and the loop filter 205. In the test mode, switch 213 couples the test tuning signal path 242 to the oscillator 209. In the test mode, switch 213 also breaks or decouples a feedback loop that includes the oscillator 209, the feedback circuitry 207, the phase detector 203, and the loop filter 205.

In some embodiments, the PLL 200 can include a charge pump (not shown). The charge pump can be coupled between the phase detector 203 and the loop filter 205.

FIG. 3 shows an example block diagram of a digital phase-locked loop 300. The digital PLL 300 includes a first digital adder 301, a digital phase detector 303, a digital loop filter 305, feedback circuitry 307 (e.g., a counter and a TDC), a digitally controlled oscillator (DCO) 309, a first multiplexer 311, and a second multiplexer 313. FIG. 3 also includes signal paths 320, 322, 324, 326, 328, 330, 332, 334, 336, 338, 340, and 342. The digital PLL 300 can function in at least two modes of operation. In some embodiments, signal paths 320, 322, 324, 326, 328, 330, 332, 334, 336, 338, 340, and 342 can be multi-bit buses that include multiple single-bit signal paths.

In the normal mode, a frequency control word FCW is combined with a feedback signal using the phase detector 303 to generate an error signal. The phase detector 303 can subtract the feedback signal from the frequency control word FCW. The error signal is filtered by a digital loop filter 305 to generate a filtered error word ΔFCW, which is provided as the oscillator tuning word (OTW) used to control the DCO 309. The DCO 309 outputs a radio frequency (RF) clock signal. The RF clock signal is also digitized by the TDC/counter 307 to generate a feedback signal for the phase detector 303. In some embodiments, the counter can count a number of oscillations of the DCO during a given period measured by the reference signal provided over signal path 332. In some embodiments, the TDC can compare a RF clock to the reference signal provided over the signal path 332. The steady state RF clock frequency is controlled by the frequency control word FCW, for example, according to the Equation 3:

$$F_{OUT} = FCW \times F_{REF} \qquad \text{Eq. 3}$$

In Equation 3, $F_{OUT}$ is the frequency of the RF clock signal, FCW is the frequency control word, and $F_{REF}$ is a frequency of a reference clock (e.g., frequency of a clock signal provided over feedback control signal path 332). The phase detector 303 compares the output of the TDC/counter 307 to the FCW to generate the ΔFCW, which is filtered to remove noise. The ΔFCW is provided to the DCO 309 to adjust the RF clock signal based on feedback.

In the test mode, the digital PLL 300 can function differently than in the normal mode. A BIST controller, such as the BIST controller 103 of FIG. 1, can provide a test OTW, which is provided as the OTW to the DCO 309. The DCO 309 outputs an RF clock signal based on the test OTW in the test mode. The oscillating output signal is provided to the TDC/counter 307, which is not part of a closed feedback loop to the oscillator 309 in the test mode. The phase detector 303 subtracts the output of the TDC/counter 307 from an indication of output frequency $FCW_{OUT}$. The indication of output frequency $FCW_{OUT}$ is provided to the phase detector 303 in the test mode, thereby generating the error signal for the test mode. The error signal is provided to the digital loop filter 305, which outputs a ΔFCW. The ΔFCW can be changed in sign and added to (or subtracted from) an FCW using an adder 301 to generate the indication of output frequency $FCW_{OUT}$. In some embodiments, the indication of the output frequency $FCW_{OUT}$ can be provided to an output contact on a chip or to a test controller on a chip (e.g., via result path 123 shown in FIG. 1).

In the test mode, the test OTW can be provided by a BIST controller, such as the BIST controller 103 of FIG. 1 The BIST controller can analyze the $FCW_{OUT}$ to characterize and/or test the digital PLL 300, for example, according to the Equation 4:

$$F_{OUT\_TEST} = f_{REF} \times FCW_{OUT} \qquad \text{Eq. 4}$$

In Equation 4, $F_{OUT\_TEST}$ is the output frequency of the DCO 309 in the test mode, $FCW_{OUT}$ is the output frequency control word. Accordingly, the $F_{OUT\_TEST}$ generated by the PLL can be calculated for a given test tuning signal when a reference clock is used.

Mode signal paths 338, 340 can receive a mode signal provided by a BIST controller, such as BIST controller 103 of FIG. 1. The multiplexers 321, 313 can be controlled by the mode signal to reconfigure the PLL to operate in the normal mode or the test mode.

Multiplexer 311 switches between providing the $FCW_{OUT}$ and providing the FCW to the phase detector 303. In the normal mode, multiplexer 311 provides the FCW to the phase detector 303. In the normal mode, multiplexer 311 also operates to break the feedback loop that includes the first adder 301, the phase detector 303, and the digital loop filter 305. For instance, the multiplexer 311 can decouple an output of the first adder 301 from the input of the phase detector 303 in the normal mode. In the test mode, multiplexer 311 provides the $FCW_{out}$ to the phase detector 303. In the test mode, multiplexer 311 also completes a feedback loop that includes the first adder 301, the phase detector 303, and the digital loop filter 305.

Multiplexer 313 switches between providing the test OTW and providing the ΔFCW to the DCO 309. In the normal mode, multiplexer 313 provides the ΔFCW to the DCO 309. In the normal mode, multiplexer 313 also operates to complete the feedback loop that includes the DCO 309, the TDC/counter 307, the phase detector 303, and the digital loop filter 305. In the test mode, multiplexer 313 couples the test OTW path 342 to the DCO 309. In the test mode, multiplexer 313 also breaks a feedback loop that includes the DCO 309, the TDC/counter 307, the phase detector 303, and the digital loop filter 305. For instance, the multiplexer 313 can decouple an output of the DLF 305 from an input of the DCO 309 in the test mode.

Figure 4:
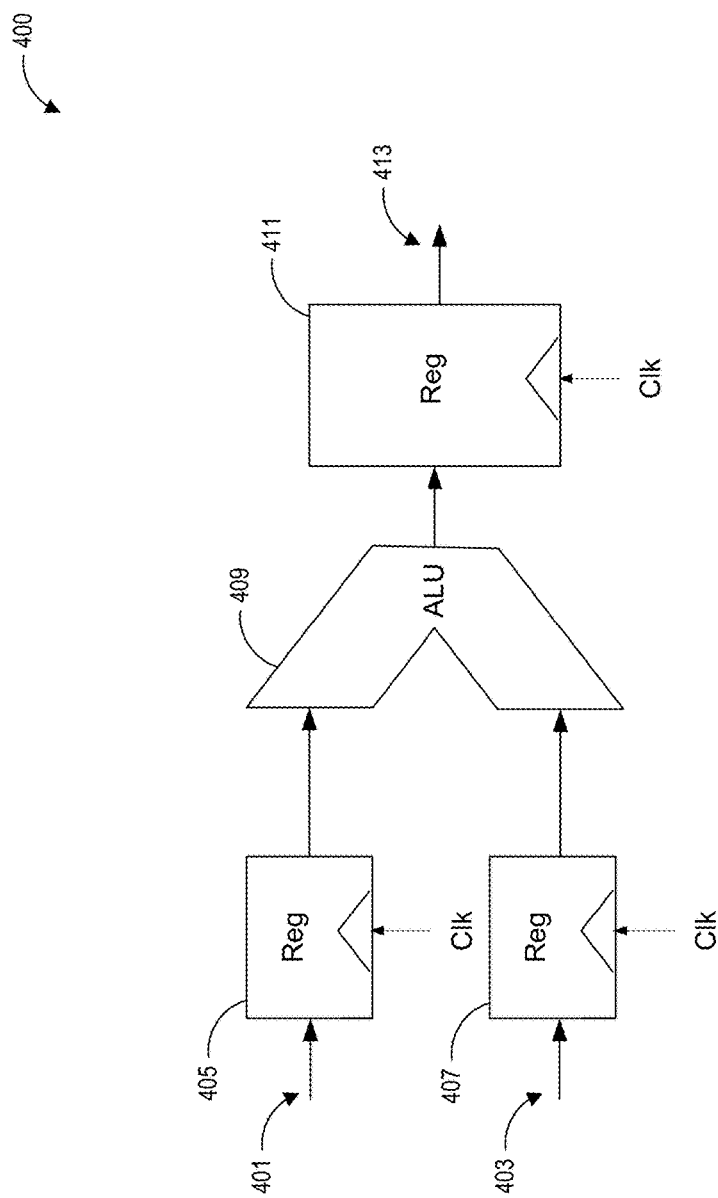
FIG. 4 is a schematic block diagram of an adder that can be implemented in the phase-locked loop of FIG. 3.

FIG. 4 is a schematic block diagram of an adder 400. The adder 400 can receive inputs over input paths 401, 403 that are stored in clocked registers 405 and 407. An arithmetic logic unit 409 (ALU) adds the inputs signals to generate an output, which is stored in a clocked output register 411. The ALU 409 can perform arithmetic operations such as digital addition (including addition of negative numbers) and/or subtraction. The output can be provided over an output signal path 413. The adder 400 is an example of an adder that can be implemented in the adders 301 and/or the phase detector 303 of FIG. 3. Other types of adders, such as adders with asynchronous inputs and/or outputs can be used, and different amounts of registers can be used.

FIG. 5 shows an example block diagram of a digital PLL 500 that is functionally equivalent to the digital PLL 300 of FIG. 3 in a normal mode. In the normal mode of the digital PLL of FIG. 3, as illustrated by FIG. 5, the FCW is combined with a feedback signal using the phase detector 303 to generate an error signal. The error signal is filtered by a digital loop filter 305 to generate the OTW used to control the DCO 309. The DCO 309 outputs a radio frequency (RF) clock signal. The RF clock signal is also digitized by the TDC/counter 307 to generate a feedback signal for the phase detector 303. The steady state RF clock frequency is controlled by the FCW and the $F_{REF}$, for example, according to Equation 3. Together, the DCO 309, the TDC/counter 307, the phase detector 303, and the digital loop filter 305 form a first feedback loop. The second feedback loop, which will be discussed in the description of FIG. 6, is not completed.

FIG. 6 shows an example block diagram of a digital phase-locked loop 600 that is functionally equivalent to the PLL of FIG. 3 in a test mode. In the test mode of the digital PLL of FIG. 3, as illustrated by FIG. 6, a BIST controller can provide a test OTW, which is provided as the OTW to the DCO 309. The DCO 309 outputs an RF clock signal based on the test OTW. The RF clock signal is provided to the TDC/counter 307, which is not part of a feedback loop to the DCO 309 in the test mode. The phase detector 303 subtracts the output of the TDC/counter 307 from an $FCW_{OUT}$ provided to the phase detector, thereby generating the error signal. The error signal is provided to the digital loop filter 305, which outputs a ΔFCW. The ΔFCW can be subtracted from an FCW using an adder 301 to generate the $FCW_{OUT}$. The first adder 301, the phase detector 303, and the digital loop filter 305 form a second feedback loop. The first feedback loop, which was discussed in the description of FIG. 5, is not completed. The test OTW provided to the DCO 309 can be unaffected by the second feedback loop.

In some embodiments, the test OTW can be provided by to the PLL 600 by a BIST controller, such as the BIST controller 103 of FIG. 1. The BIST controller can analyze the $FCW_{OUT}$ to characterize and/or test the digital PLL 300, for example, according to Equation 4. Accordingly, the $F_{OUT}$ generated by the PLL 300 can be calculated for a given test tuning signal when a reference clock is used.

Figure 7:
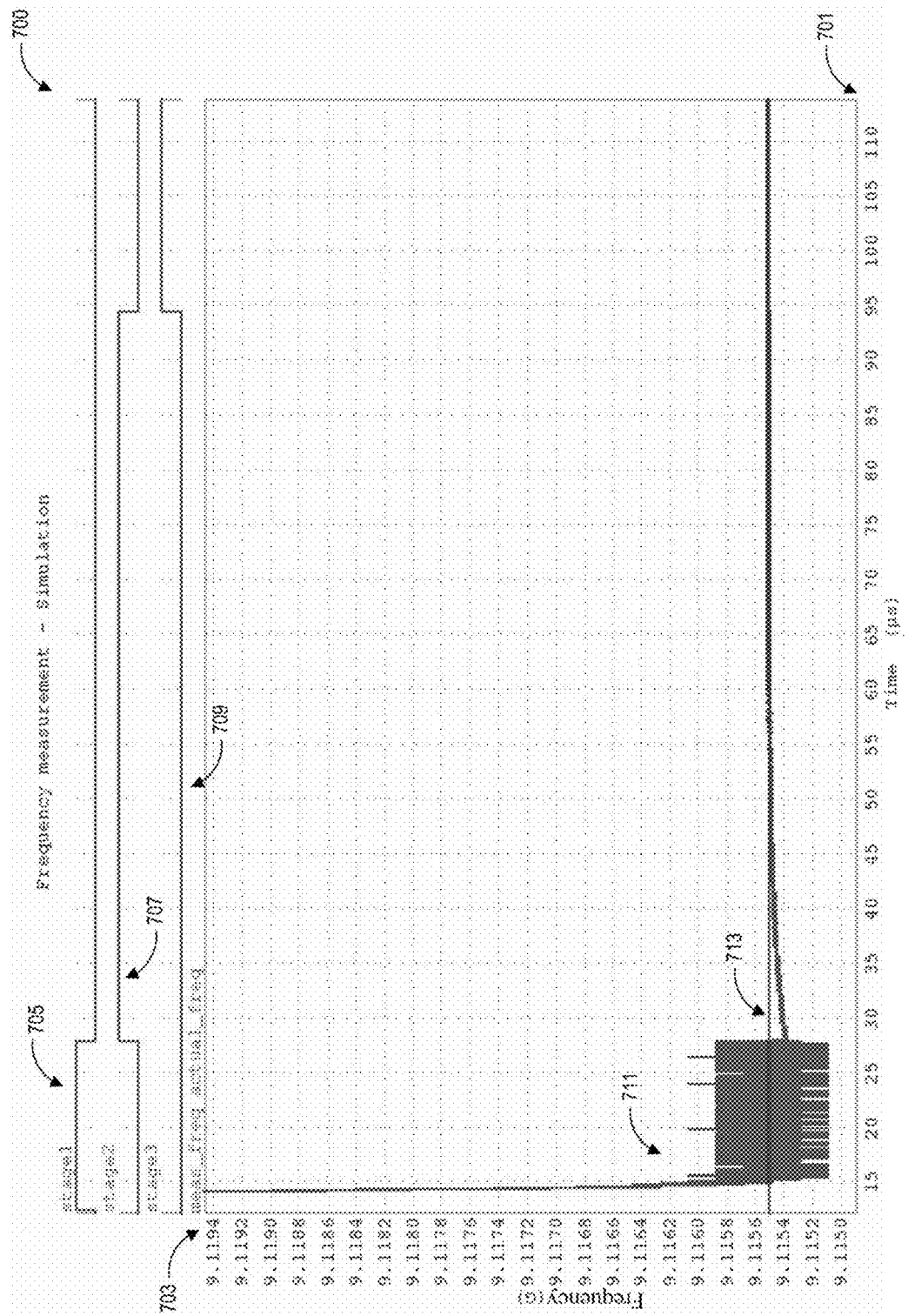
FIG. 7 shows a graph of results from a simulation of the phase-locked loop of FIG. 3.
Figure 8:
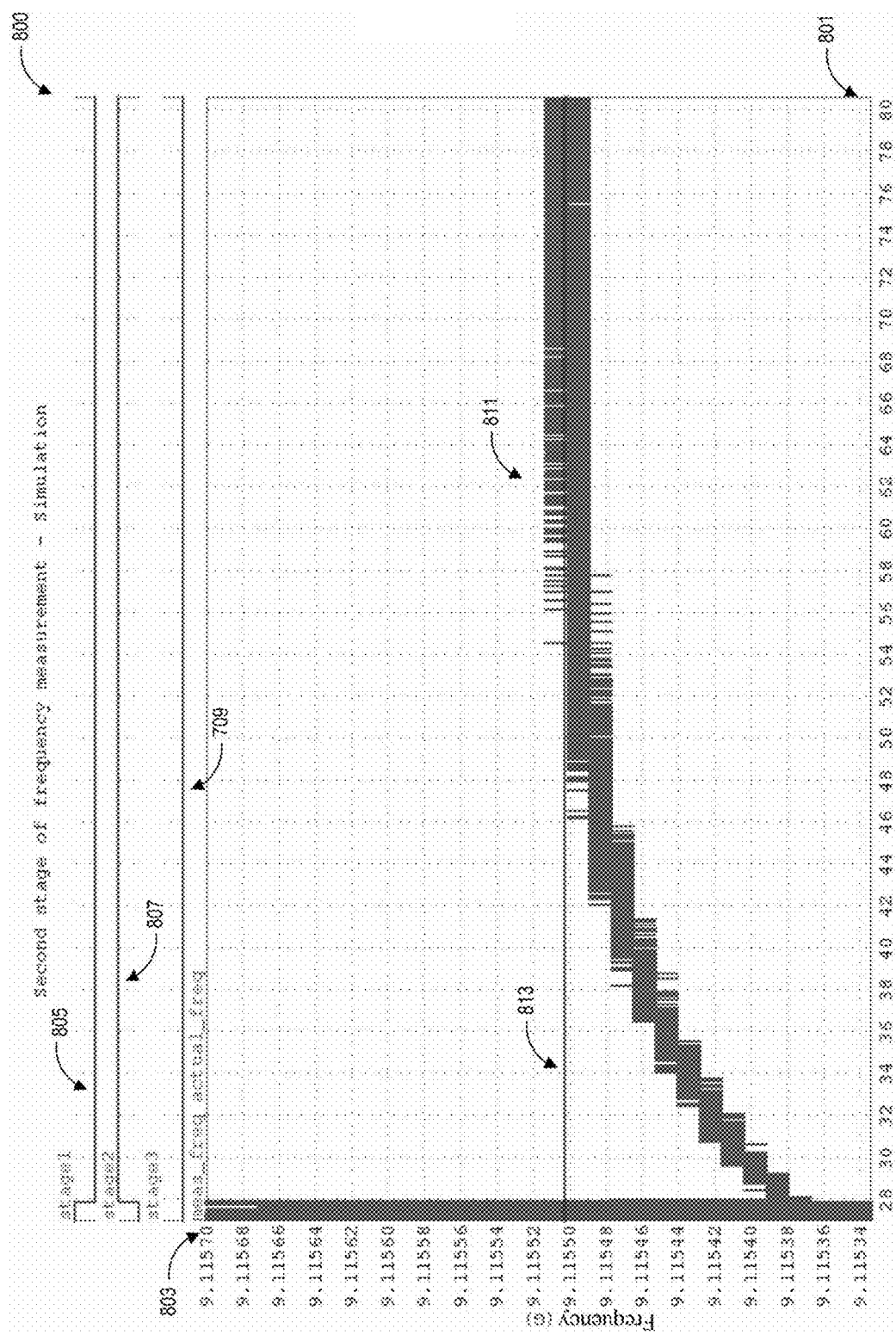
FIG. 8 shows a graph of zoomed in results from a second stage of the simulation corresponding to FIG. 7.
Figure 9:
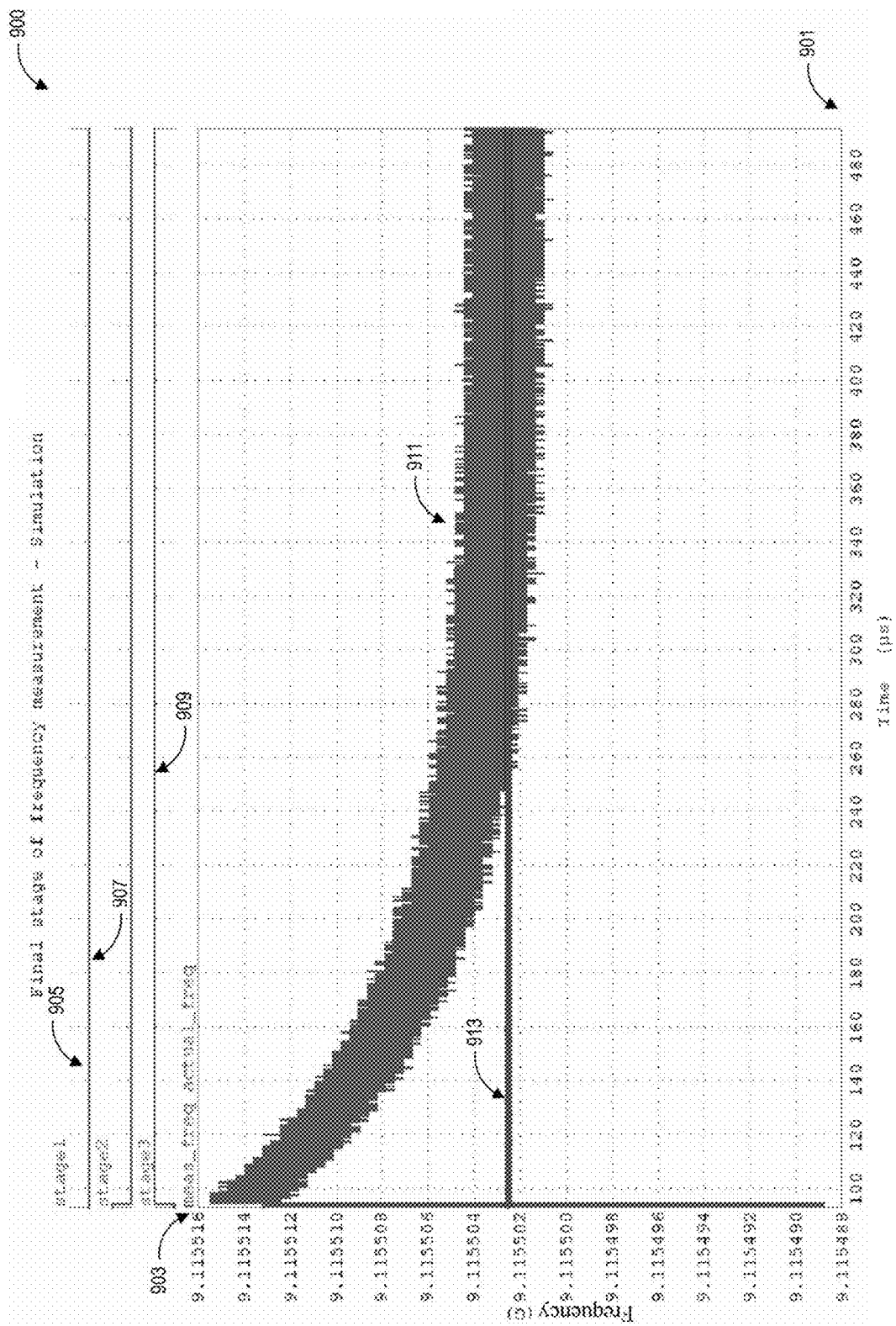
FIG. 9 shows a graph of results from a third stage of the simulation corresponding to FIG. 7.

FIG. 7, FIG. 8, and FIG. 9 show graphs of an example simulation results for the PLL 300 of FIG. 3. The simulation was run on a PLL configured in a test mode. During the test mode, a first OTW can be provided to the oscillator by a test controller, and a corresponding first FCW can be provided to the PLL. While the first OTW is being provided, the test controller can detect the $FCW_{OUT}$. It can take time for the $FCW_{OUT}$ to settle and reach a steady state value. During a test, a plurality of OTWs may be used, and a plurality of $FCW_{OUT}$ values may be measured in response. This can take a relatively long time in some instances, increasing the production time. However, bandwidth of the loop filter of the PLL can be controlled during the acquisition of an $FCW_{OUT}$ to speed up the test. When an OTW is applied, the loop filter can be set with a relatively large bandwidth for a first amount of time. The relatively large bandwidth can be larger than a bandwidth that would be used during the normal test mode. This can allow the $FCW_{OUT}$ to quickly settle around a first value. However, the first value may be a coarse estimate due to noise or other factors. Next, the bandwidth of the loop filter can be narrowed so that the $FCW_{OUT}$ settles around a finer value. This settling can occur at a slower rate than when the bandwidth of the loop filter is at a larger value. Accordingly, each time a test is run with a new OTW, the bandwidth of the loop filter can be set to be broad so that the $FCW_{OUT}$ can quickly settle at a coarse value, and then the bandwidth of the loop filter can be narrowed so that $FCW_{OUT}$ can settle on a more precise value.

When the bandwidth of the loop filter is being changed after a first stage, the FCWout being applied to the PLL can be held constant or stored in a flip flop. Also, the phase error can be reset to zero. During a second stage when the bandwidth of the loop filter is narrowed, the system can operate on residual error left over after the first stage. An output determined during the second stage can be added to the FCWout determined during the first stage.

FIG. 7 shows a graph 700 of example simulation results for the PLL of FIG. 3 in test mode. The x-axis 701 shows time in microseconds. The y-axis 703 indicates frequency values in GHz. A first signal 705, when asserted high, indicates a first duration of time during which the loop filer was set with a wide bandwidth. A second signal 707, when asserted high, indicates a second duration of time during which the loop filter was set with a medium bandwidth. A third signal 709, when asserted high, indicates a third duration during which the loop filter was set with a narrow bandwidth. A curve 711 indicates the measured frequency value based on $FCW_{OUT}$. A test OTW and an FCW are being provided to the PLL in the simulation. A line 713 indicates the frequency value that the PLL is specified to output while being provided with the FCW in the first mode.

FIG. 8 shows a graph 800 of the same simulation as graph 700, but starting at 28 microseconds and with a narrower range on the y-axis 703. The graph 800 corresponds to a second stage with medium bandwidth. FIG. 9 shows a graph 900 of the same simulation as in FIG. 8, but starting at 100 microseconds and with an even narrower range on the y-axis 703. The graph 900 corresponds to a third stage with smaller bandwidth.

It can be seen that, when the bandwidth was wide, the curve 711 quickly approaches the specified frequency value between about 9.115502 GHz and 9.115503 GHz. In fact, in less than 15 microseconds, the curve 711 drops from above 9.1190 GHz to below 9.1160 GHz. However, the curve 711 then oscillates from about 9.1151 GHz to about 9.1159 GHz until about 28 microseconds.

Starting from the 28 microsecond mark, the bandwidth of the loop filter is reduced to a medium bandwidth, as indicated by the second signal 707 being asserted. The curve 711 then begins to steadily approach the specified frequency value between 9.115502 GHz and 9.115503 GHz with more precision. However, the curve 711 approaches the specified frequency at a slower rate, changing by about 0.00012 GHz over the course of approximately 22 microseconds.

Starting from the 100 microsecond mark, the bandwidth of the loop filter is reduced to a narrow bandwidth, as indicated by the third signal 709 being asserted. The curve 711 continues to steadily approach the specified frequency value between 9.115502 GHz and 9.115503 GHz, settling with even more precision on values between 9.115500 GHz to 9.115505 GHz over the next few hundred microseconds.

Accordingly, the bandwidth can be initially set as a relatively wide bandwidth for a fast conversion speed and then reduced to narrower bandwidths to increase precision. When repeated for thousands or millions of tests for a corresponding number of PLLs, a substantial amount of production time can be reduced without sacrificing test quality.

Figure 10:
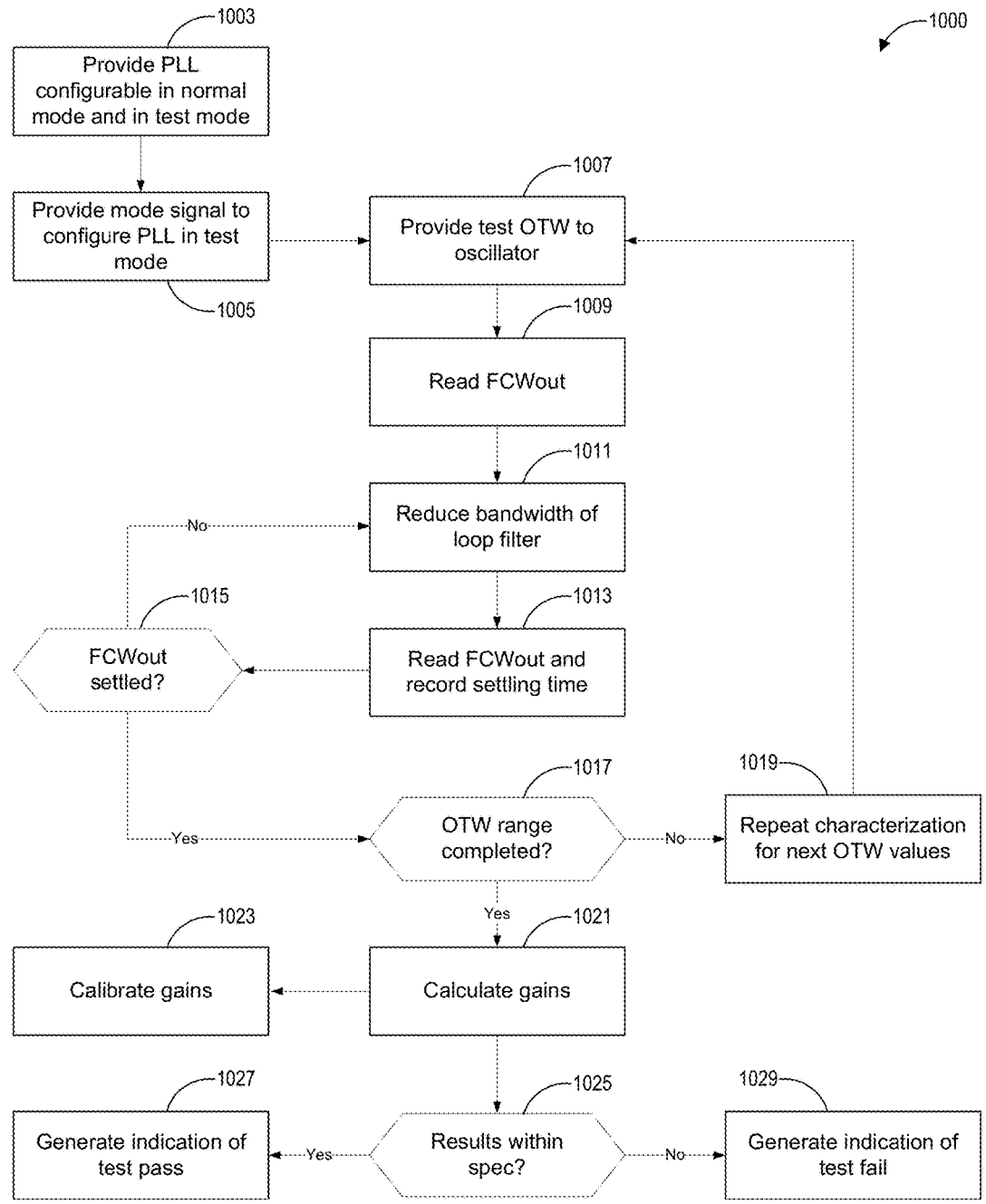
FIG. 10 shows a flowchart of an example method for characterizing and testing a PLL circuit.

FIG. 10 shows a flowchart 1000 of an example method for characterizing and testing a PLL circuit. To aid understanding, the method 1000 is described with references to the digital PLL 300 of FIG. 3 and the functionally equivalent PLL 600 in test mode of FIG. 6. However, the principles and teachings of method 1000 can apply to other PLL circuits as well, such as PLL 200 shown in FIG. 2.

At block 1003, a PLL is provided. The PLL can be configurable in a normal mode and also configurable in a test mode. The PLL can be, for example, digital PLL 300 of FIG. 3, which can be configured in a normal mode or in a test mode based on a mode signal.

At block 1005, the mode signal is provided to configure the PLL in test mode. FIG. 6 shows an example block diagram of a digital PLL 600 that is functionally equivalent to the digital PLL 300 of FIG. 3 in a test mode. The mode signal can be provided to multiplexers to configure the PLL in the test mode.

At block 1007, a test OTW is provided to the oscillator of the PLL. In some embodiments, the test OTW can be provided by a BIST controller (for example, the BIST controller 103 of FIG. 1). The first value of the test OTW can be retrieved from a memory of the BIST controller.

At block 1009, the $FCW_{OUT}$ is read. For example, the $FCW_{OUT}$ can be provided to a BIST controller and stored in a memory. In some embodiments, the $FCW_{OUT}$ can be detected and recorded after a period of time that allows the $FCW_{OUT}$ to settle, and the method 1000 can proceed from block 1009 to block 1017.

Blocks 1011, 1013, and 1015 illustrate an example bandwidth control technique (for example, as discussed with respect to FIG. 7, FIG. 8, and FIG. 9). The additional blocks 1011, 1013, and 1015 can be used to quickly test a PLL. In some embodiments, blocks 1011, 1013, and 1015 can be performed in place of block 1009.

At block 1011, a bandwidth of a loop filter, such as digital loop filter 305, is reduced. The bandwidth of the loop filter can be reduced any suitable number of times. In some embodiments, the test OTW and corresponding FCW can be provided to the PLL for a first time duration to allow $FCW_{OUT}$ to settle on a first, coarse $FCW_{OUT}$ value, and then the bandwidth of the loop filter can be reduced. In some embodiments, after the bandwidth of the loop filter is reduced, the $FCW_{OUT}$ is allowed to settle on a more refined $FCW_{OUT}$ value during a second time duration.

At block 1013, the $FCW_{OUT}$ value can be read and the settling time can be recorded. The $FCW_{out}$ value and settling times can be stored in the memory of the BIST controller or used by the BIST controller to calculate a PLL response.

At block 1015, it can be determined if the $FCW_{OUT}$ is settled. It can be determined that the $FCW_{OUT}$ is settled if the $FCW_{OUT}$ varies within a particular range. It can also be determined that the $FCW_{OUT}$ is settled if a settling duration of time has passed. It can also be determined that the $FCW_{OUT}$ is settled if the bandwidth of the loop filter has been narrowed to a particular bandwidth. If the $FCW_{OUT}$ has not settled after a predetermined period of time, then the method can proceed back to block 1011. If the $FCW_{OUT}$ settles, then the method can proceed to block 1017.

In some embodiments, variations or equivalents of Equation 4 can be used. For example, one or more constants can affect the equation for a particular system. As another example, the ΔFCW can be read by the BIST controller instead of the $FCW_{OUT}$, and the BIST controller can add the ΔFCW to the FCW being set by the BIST so that the BIST controller can calculate the $FCW_{OUT}$.

At block 1017, it can be determined if the full range of OTWs is completed. If not, then at block 1019, the next OTW can be determined or retrieved from a memory of the BIST controller, and then the blocks 1007-1017 can be repeated for the next OTW. If at block 1017, the test range is completed, then one or more gain values can be calculated. A gain value can be calculated by dividing a change in the output frequency of a PLL by a change in the OTW.

At block 1021, the gains can be calculated based, at least in part, on the change in frequency per change in OTW. The gain of the oscillator can affect the loop dynamics in normal mode.

At block 1023, the gain of the PLL can be calibrated based, at least in part, on the calculated gains. The gain can calibrate to adjust for variations over process, voltage, and temperature, and also OTW values. Calibrating the gain can lead to constant loop dynamics in normal mode.

At block 1025, it can be determined if the characterized results satisfy specifications for the PLL. This can include determining if one or more PLL outputs would be within a specified range of values for each FCW provided during the normal mode, determining if the gain of the PLL is within a specified value across one or more ranges of FCW's, determining if the settling times occur within a specified time frame, etc.

If the results meet the specifications, then an indication of a test pass can be generated at block 1027. If the results fail to meet the specifications, than an indication of a test fail can be generated at block 1029. The generated test result indicator can be, for example, stored in a register, output over a dedicated signal path, encoded on one or more other signal paths, etc. In some embodiments, failed PLLs can be disabled.

In the embodiments described above, apparatus, systems, and methods for measuring a PLL are described in connection with particular embodiments. It will be understood, however, that the principles and advantages of the embodiments can be used for any other systems, apparatus, or methods. Various embodiments can apply different techniques for testing and/or characterizing PLL's. Some techniques can apply to digital PLL's. Some techniques can include changing a bandwidth of a loop filter to shorten a test duration. Some techniques can include changing a PLL configured in a normal mode to be configured into a test mode, wherein some parts of the PLL used in the normal mode are also reused in the test mode to generate test result signals. Some techniques can include calculating a frequency of a PLL operating in a normal mode based on an $FCW_{OUT}$ generated by the PLL during a test mode.

Although certain embodiments are described with reference to particular signals of a digital PLL, it will be understood that the principles and advantages described herein can be applied to other signals of other types of PLLs, which can be used in a variety of applications. While some embodiments are described with respect to a BIST controller shown in FIG. 1, it will be understood that the principles and advantages described herein can be applied to other types of test setups. Moreover, while some circuits schematics are provided for illustrative purposes, other equivalent circuits can alternatively be implemented to achieve the functionality described herein.

In any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not necessarily be construed to imply that these operations are order dependent. The acts of the methods discussed herein can be performed in any order as appropriate. Moreover, the acts of the methods discussed herein can be performed serially or in parallel, as appropriate. Two blocks shown in succession may, in fact, be executed substantially concurrently, or the blocks may sometimes be executed in the reverse order, depending upon the functionality involved. In addition, certain blocks may be omitted in some implementations.

For example, in the flowchart 1000, reading the $FCW_{OUT}$ can, in various embodiments, occur before or after a bandwidth is changed. In some embodiments, one or more blocks related to narrowing a bandwidth of a loop filter can be skipped. In some embodiments, a test pass or fail can be determined at a different stage, for example, as each response of a PLL is calculated. In some embodiments, the gain calculations can be performed as part of each repeated test indicated in block 1019. In some embodiments, no gains are calculated. In some embodiments, the test not need generate indications of both passing and failing.

The principles and advantages described herein can be implemented in various apparatuses. Also, PLL's can be used in various apparatuses, and PLL's that perform at specifications and provided at lower costs can decrease the overall price of those various apparatuses. Examples of such apparatuses can include, but are not limited to, consumer electronic products, parts of the consumer electronic products, electronic test equipment, etc. Examples of parts of consumer electronic products can include clocking circuits, analog-to-digital converts, amplifiers, rectifiers, programmable filters, attenuators, variable frequency circuits, etc. Examples of the electronic devices can also include memory chips, memory modules, circuits of optical networks or other communication networks, cellular communications infrastructure such as base stations, radar systems, and disk driver circuits. Consumer electronic products can include, but are not limited to, wireless devices, a mobile phone (for example, a smart phone), a wearable computing device such as a smart watch or an ear piece, healthcare monitoring devices, vehicular electronics systems, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that can be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. The term "based on," as generally used herein, encompasses the following interpretations of the term: solely based on or based at least partly on. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the embodiments provided herein can be applied to other systems, not necessarily the systems described above. The elements and acts of the various embodiments described above can be combined to provide further embodiments.

While certain embodiments have been described, these embodiments have been presented by way of example only, and are not intended to limit the scope of the disclosure. Indeed, the novel methods and systems described herein can be embodied in a variety of other forms. Furthermore, various omissions, substitutions and changes in the form of the methods and systems described herein can be made without departing from the spirit of the disclosure. The accompanying claims and their equivalents are intended to cover such forms or modifications as would fall within the scope and spirit of the disclosure.

What is claimed is:

1. A phase-locked loop operable in a plurality of modes, the phase-locked loop comprising:
   an oscillator configured to generate an oscillating output signal; and
   a loop filter configured to filter an output of a phase detector of the phase-locked loop;
   wherein an input to the oscillator is coupled to an output of the loop filter in a first mode;
   wherein the input to the oscillator is decoupled, at least in part, from the output of the loop filter in a second mode; and
   wherein the phase-locked loop is configured to output an indication of a frequency of the oscillating output signal based at least partly on the output of the loop filter in the second mode.

2. The phase-locked loop of claim 1, further comprising a time-to-digital converter, wherein the oscillator is a digitally controlled oscillator and the time-to-digital converter is coupled in a feedback path between the digitally controlled oscillator and the loop filter in the first mode.

3. The phase-locked loop of claim 1, further comprising an adder configured to combine a frequency input signal with a filtered output signal provided by the loop filter in the second mode.

4. The phase-locked loop of claim 1, further comprising a first switch configured to provide a tuning signal to the oscillator in the first mode and to provide a test tuning signal to the oscillator in the second mode, wherein the tuning signal is based on an error signal generated by the phase detector of the phase-locked loop, and wherein the test tuning signal is based on a source independent of the error signal.

5. The phase-locked loop of claim 4, further comprising a second switch configured to provide the tuning signal to the phase detector in the first mode and to close a feedback loop comprising the loop filter, the phase detector, and an adder in the second mode.

6. The phase-locked loop device of claim 1, wherein the indication of the frequency of the oscillating output signal is based at least in part on the output of the loop filter and a frequency control word.

7. The phase-locked loop of claim 1, wherein the entire input of the oscillator is decoupled from the loop filter in the second mode.

8. A method of testing a phase-locked loop, the method comprising:
   configuring an input of an oscillator of the phase-locked loop to be independent of an output of the oscillator in a test mode;
   providing a feedback path from an output of a phase detector to an input of the phase detector in the test mode; and
   providing an output from the feedback path to a test controller implemented on the same chip as the phase-locked loop.

9. The phase-locked loop of claim 1, wherein:
   the input of the oscillator of the phase-locked loop is independent of an output of the oscillator in the second mode;
   a feedback path is provided from an output of the phase detector to an input of the phase detector in the second mode; and
   an output from the feedback path is provided to a test controller implemented on a same chip as the phase-locked loop.

10. The phase-locked loop of claim 1, further comprising an adder and a switch coupled between the output of the loop filter and an input of the phase detector wherein a feedback path from the output of the phase detector to the input of the phase detector in the second mode comprises the loop filter, the adder, and the switch.

11. The phase-locked loop of claim 1, wherein the oscillator is a digitally controlled oscillator (DCO) and the input to the oscillator is an input to the DCO, and the phase-locked loop further comprises:
   a multiplexer configured to couple the input of the DCO to the output of the phase detector of the phase-locked loop in the first mode and configured to provide a test oscillator tuning word to the input of the DCO in the second mode; and
   a test control circuit configured to provide, in the second mode, the test oscillator turning word and also configured to determine, in the second mode, the indication of an output frequency of the phase-locked loop, wherein the test control circuit and the DCO are embodied on a common chip.

12. The phase-locked loop of claim 11, wherein the phase detector is configured to generate an error signal in the second mode based on a comparison of a feedback signal from a feedback path with a frequency command output signal that is dependent on the output of the phase detector, wherein the frequency command output signal is the indication of the output frequency of the phase-locked loop.

13. The phase-locked loop of claim 12, wherein the test control circuit is further configured to generate a test result based on a frequency of a reference clock and the frequency command output signal.

14. The phase-locked loop of claim 11, wherein the test control circuit is further configured to provide a frequency command word in the second mode, and the frequency command word is associated with the test oscillator tuning word in a memory of the test control circuit.

15. The phase-locked loop of claim 11, further comprising a digital loop filter configured to filter a digital error signal generated by the phase detector, wherein an output of the digital loop filter is coupled to the input of the DCO in the first mode.

16. The phase-locked loop of claim 15, wherein the digital loop filter is configured to operate with a first bandwidth and then operate with a second bandwidth that is narrower than the first bandwidth in the second mode for the same test oscillator tuning word.

17. The phase-locked loop of claim 1, wherein the phase-locked loop is a digital phase-locked loop, and wherein the oscillator is a digitally controlled oscillator.

18. The phase-locked loop of claim 1, wherein the loop filter is included in a first feedback loop in the first mode, and wherein the loop filter is included in a second feedback loop in the second mode.

* * * * *

UNITED STATES PATENT AND TRADEMARK OFFICE
CERTIFICATE OF CORRECTION

PATENT NO. : 10,295,580 B2  
APPLICATION NO. : 15/284374  
DATED : May 21, 2019  
INVENTOR(S) : Vamshi Krishna Chillara Page 1 of 1

It is certified that error appears in the above-identified patent and that said Letters Patent is hereby corrected as shown below:

On the Title Page

Column 2, Line 1, above item [74], change "Portich" to --Fortich--.

In the Specification

Column 7, Line 36, change "$f_{FEF}$" to --$f_{REF}$--.

Column 10, Line 30, change "$F_{OUT}$" to --$F_{OUT\_TEST}$--.

In the Claims

Column 15, Line 59, Claim 6, delete "device".

Column 16, Line 8, Claim 8, change "the same chip" to --a same chip--.

Signed and Sealed this  
Nineteenth Day of November, 2019

Andrei Iancu  
*Director of the United States Patent and Trademark Office*